US005136764A

United States Patent [19]

Vasquez

[11] Patent Number: 5,136,764

[45] Date of Patent: Aug. 11, 1992

[54] METHOD FOR FORMING A FIELD EMISSION DEVICE

[75] Inventor: Barbara Vasquez, Chandler, Ariz.

[73] Assignee: Motorola, Inc., Schaumburg, Ill.

[21] Appl. No.: 588,912

[22] Filed: Sep. 27, 1990

[51] Int. Cl.$^5$ ........................ B23B 5/28; H01L 21/302

[52] U.S. Cl. ................................ 29/25.01; 201/25.02; 437/225; 437/228

[58] Field of Search ............................ 29/25.01, 25.02; 156/643, 644; 437/235, 984, 208, 228; 357/68, 85; 445/50, 51

[56] References Cited

U.S. PATENT DOCUMENTS

| | | | |
|---|---|---|---|
| 3,755,704 | 8/1973 | Spindt et al. | 313/309 |
| 3,789,471 | 2/1974 | Spindt et al. | 445/50 |
| 3,812,559 | 5/1974 | Spindt et al. | 29/25.18 |
| 3,894,332 | 7/1975 | Nathanson et al. . | |
| 3,921,022 | 11/1975 | Levine . | |
| 3,970,887 | 7/1976 | Smith et al. . | |
| 3,998,678 | 12/1976 | Fukase et al. . | |
| 4,008,412 | 2/1977 | Yuito et al. . | |
| 4,178,531 | 12/1979 | Alig . | |
| 4,307,507 | 12/1981 | Gray et al. . | |
| 4,498,952 | 2/1985 | Christensen | 445/51 |
| 4,513,308 | 4/1985 | Greene et al. . | |
| 4,578,614 | 3/1986 | Gray et al. . | |
| 4,685,996 | 8/1987 | Busta et al. . | |
| 4,721,885 | 1/1988 | Brodie | 313/576 |
| 4,827,177 | 5/1989 | Lee et al. | 313/306 |
| 4,874,981 | 10/1989 | Spindt | 313/309 |
| 4,889,821 | 12/1989 | Selle et al. | 437/31 |
| 4,901,028 | 2/1990 | Gray et al. . | |
| 4,916,083 | 4/1990 | Monkowski et al. | 437/203 |
| 4,956,574 | 9/1990 | Kane | 445/51 |

FOREIGN PATENT DOCUMENTS

| | | | |
|---|---|---|---|
| 0172089 | 7/1985 | European Pat. Off. . | |
| 2604823 | 10/1986 | France . | |
| 0160740 | 12/1981 | Japan | 445/50 |
| 855782 | 6/1977 | U.S.S.R. . | |
| 2204991A | 11/1988 | United Kingdom . | |

OTHER PUBLICATIONS

A Vacuum Field Effect Transistor Using Silicon Field Emitter Arrays, by Gray, 1986 IEDM.

Advanced Technology: flat cold-cathode CRTs, by Ivor Brodie, Information Display Jan. 1989.

Field-Emitter Arrays Applied to Vacuum Flourescent Display, by Spindt et al., Jan., 1989 issue of IEEE Transactions on Electronic Devices.

Field Emission Cathode Array Development For High--Current Density Applications by Spindt et al., dated Aug., 1982 vol. 16 of Applications of Surface Science.

*Primary Examiner*—Robert Kunemund
*Assistant Examiner*—Loc Q. Trinh
*Attorney, Agent, or Firm*—Eugene A. Parsons

[57] ABSTRACT

A method for forming a field emission device. The method includes steps which utilize sidewall spacer formation techniques. The sidewall spacer(s) are employed to properly orient the various conductive elements of the field emission device.

5 Claims, 4 Drawing Sheets

METHOD FOR FORMING A FIELD EMISSION DEVICE

TECHNICAL FIELD

This invention relates generally to cold-cathode field emission devices and more specifically to a method for forming a field emission device.

BACKGROUND OF THE INVENTION

Cold-cathode field emission devices (FEDs) are known in the art. Such prior art devices are constructed by a variety of methods all of which yield structures with the purpose of emitting electrons from an emitter electrode.

A common shortcoming of these prior art methods is that they do not provide for simplified fabrication. In one prior art method, multiple simultaneous vapor phase depositions are required. In another prior art method which employs preferential wet-etch techniques, specific semiconductor crystal orientations must be employed to achieve the desired geometric features and registration of electrodes is an issue of concern. In yet other prior art methods, the desired very small radius of curvature of the emitting tip or edge is not readily achieved.

Accordingly, there exists a need for an improved method of fabricating cold-cathode field emission devices that substantially overcomes at least some of these shortcomings.

SUMMARY OF THE INVENTION

These needs and others are substantially met through provision of an FED fabrication methodology disclosed herein. Pursuant to this invention an FED is formed by a method which employs a sequence of depositions of layers of insulators and conductors or semiconductors and a sequence of etch steps and formation of a sidewall spacer, or plurality of spacers, within a cavity which results from the etch sequence. A centrally located conductor is grown or deposited within the spacer insulated cavity.

The FED realized by employing this method requires only standardized semiconductor processing techniques and does not employ multiple, simultaneous, non-coincident, vapor-phase depositions or wet etch techniques of the prior art.

In alternative embodiments of the invention, FEDs formed by this method are disposed on a surface of a conductive region in a manner that provides a means of addressing the FEDs by selectively independently applying an extraction potential to a single FED or simultaneously to a plurality of FEDs are employed.

BEST MODE FOR CARRYING OUT THE INVENTION

Figure 1A:
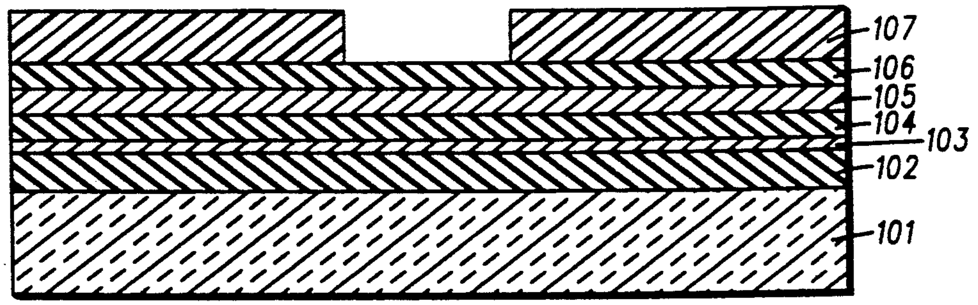
FIGS. 1*a*–*j* provide a side elevational cross-sectional depiction of the structure resulting from various steps in constructing various embodiments of an FED in accordance with the invention.

In FIG. 1*a*, a platform, such as a substrate (101), has deposited on a surface thereof a plurality of layers of material including, in this embodiment, a first insulator layer (102), a first conductive layer (103), a second insulator layer (104), a second conductive layer (105), a third insulator layer (106), and a photomask layer (107) that has been selectively exposed, developed, and patterned. The first conductive layer (103) and the second conductive layer (105) may comprise either metallic or semiconductor material and need not be the same material within a device.

Figure 1B:
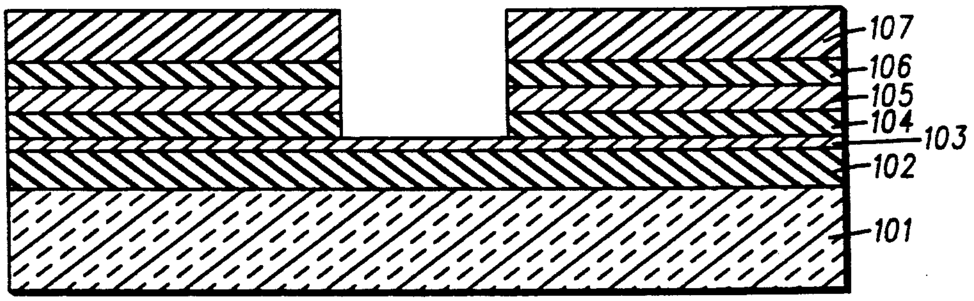

A selective, anisotropic preferential dry-etch, also known as a directed etch, is employed (FIG. 1*b*), which dry-etch selectively removes material from the region associated with the selectively exposed surface of the third insulator layer (107) to an extent that a surface of the second conductive layer (105) is selectively partially exposed in substantial conformance to the pattern of the selectively patterned photomask layer (107). Subsequently, the preferential dry-etch technique is continued to selectively remove, in turn, material from the second conductive layer (105), and the second insulator layer (104) to the extent that a surface of the first conductive layer (103) is selectively partially exposed in substantial conformance to the pattern of the selectively patterned photomask layer (107).

Figure 1C:
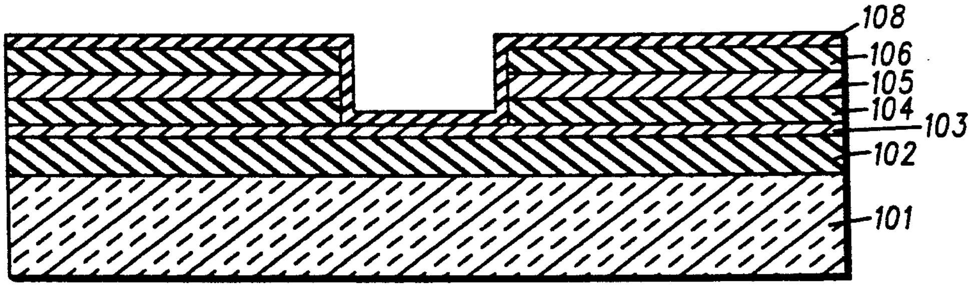
Figure 1D:
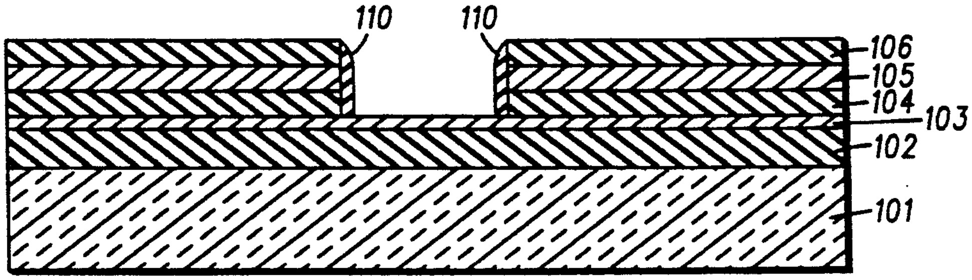

A layer of insulator material (108) is conformally deposited (FIG. 1*c*) and subsequently directionally etched (FIG. 1*d*) to provide a sidewall spacer (110) which sidewall spacer (110) is substantially disposed at least partially on a surface of each of the first conductive layer (103), second insulator layer (104), second conductive layer (105), and third insulator layer (106).

Figure 1E:
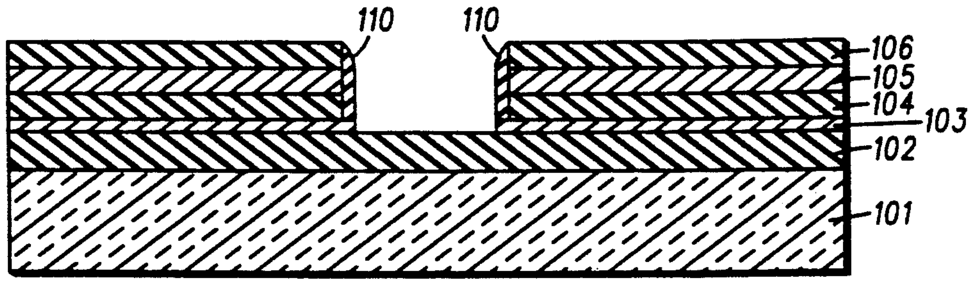
Figure 1F:
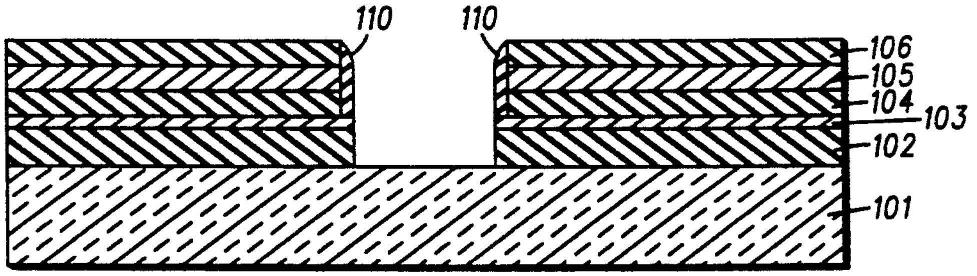

A preferential dry-etch is performed to selectively remove at least a part of the first conductive layer (103) (FIG. 1*e*) to the extent that a surface of the first insulator layer (102) is selectively partially exposed in substantial conformance to the pattern of the selectively patterned photomask layer (107). The preferential dry-etch technique is continued to selectively remove at least some material from the first insulator layer (102) (FIG. 1*f*) to the extent that a surface of the substrate (101) is selectively partially exposed in substantial conformance to the pattern of the selectively patterned photomask layer (107).

Figure 1G:
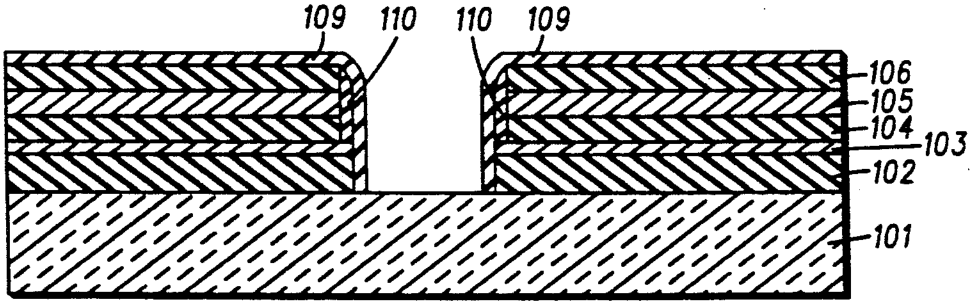
Figure 1H:
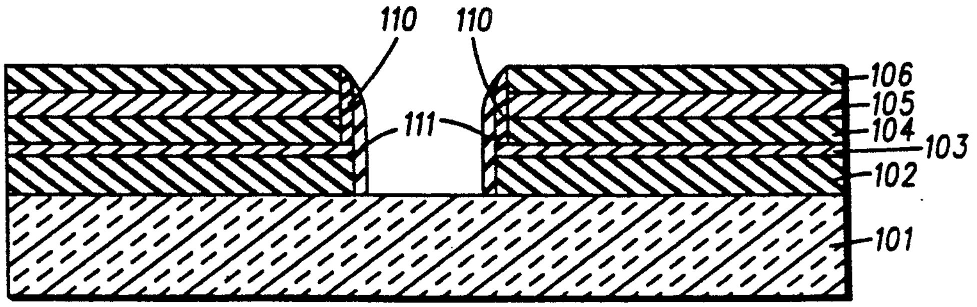
Figure 1I:
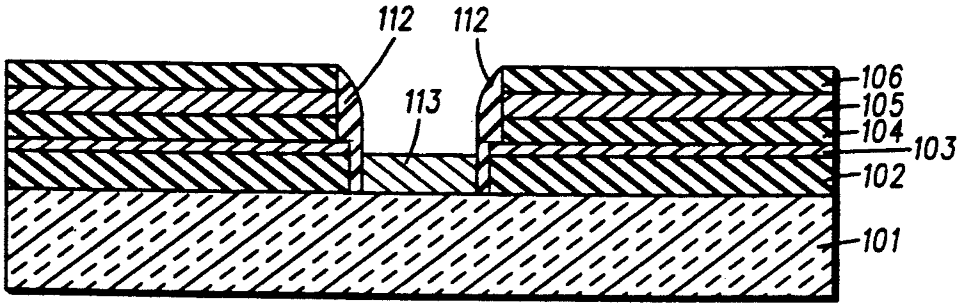

An insulator layer (109) is conformally deposited (FIG. 1*g*) and subsequently preferentially dry-etched to the extent that the insulator layer (109) provides sidewall spacer (111) (FIG. 1*h*) in addition to that provided by the sidewall spacer (110) to result in a combined sidewall spacer (112) (FIG. 1*i*).

The initial thickness of the conformally deposited insulator layers (108 and 109) will determine the subsequent width of each of the sidewall spacers (110 and 111) and the width of the combined sidewall spacer (112). In this manner the relationship of the diameters of the apertures of the first conductive layer (103) and the second conductive layer (105) with respect to the diameter of the cavity formed within the combined sidewall spacer (112) is controlled.

Figure 1J:
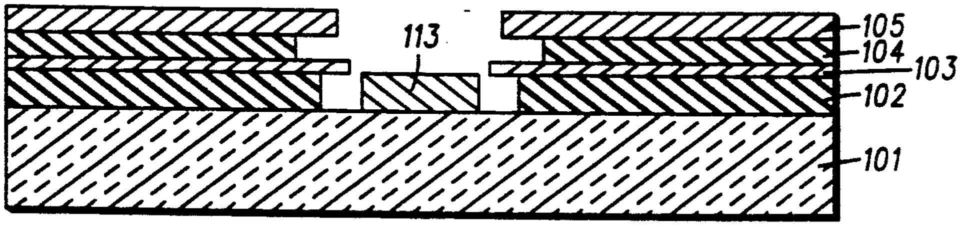

Subsequently, a central conductor (113) is formed within the previously described cavity and disposed directly on a surface of the substrate (101). Formation of the central conductor (113) may be by any known methods including epitaxial growth or directional deposition of metallic or semiconductor materials. An isotropic etch follows to provide at least partial removal of the conformed layer (112) within the cavity and at least partial removal of the insulator layers (102, 104, and 106) (FIG. 1*j*). So formed, the resultant FED has a central conductor (113), a first conductive layer (103), and a second conductive layer (105), all of which are substantially axially symmetrically positioned with respect to each other.

In an alternative embodiment of an FED formed by the method of this invention, the third insulator layer (106) may be completely removed.

Figure 2A:
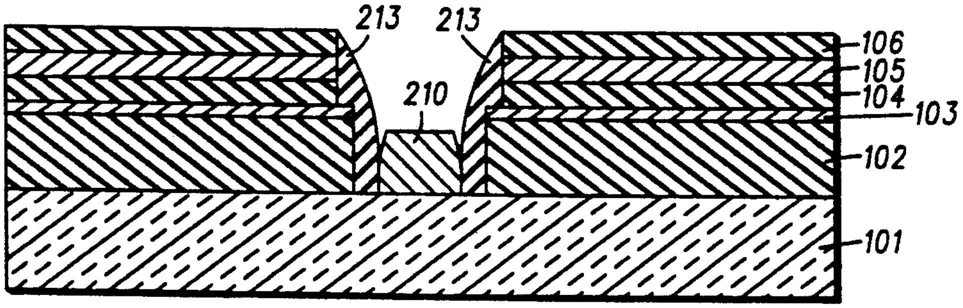
FIGS. 2*a*–*b* provide a side elevational cross-sectional depiction of the structure resulting from various steps on constructing various embodiments of an FED in accordance with the invention.
Figure 2B:
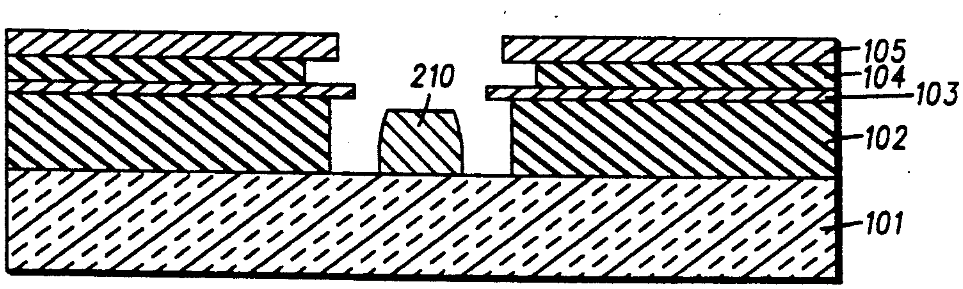

Yet another embodiment of an FED employing the method of this invention is depicted in FIGS. 2*a–b* and as described above with reference to FIGS. 1*a–j*. Particularly, the thickness of the first insulator layer (102) (FIG. 2*a*) is selected so that the height to diameter ratio of the cavity formed within the combined sidewall spacer (213) will provide for a tapered profile central conductor (210) provided that the central conductor (210) is formed by substantially normally directed vapor deposition. A subsequent isotropic etch is performed to remove at least part of the combined sidewall spacer (213) and part of each of the insulator layers (102, 104, and 106) (FIG. 2*b*).

Still another embodiment of an FED employing the method of this invention, as described above with reference to FIGS. 2*a–b*, may have the entire third insulator layer (206) removed.

Figure 3A:
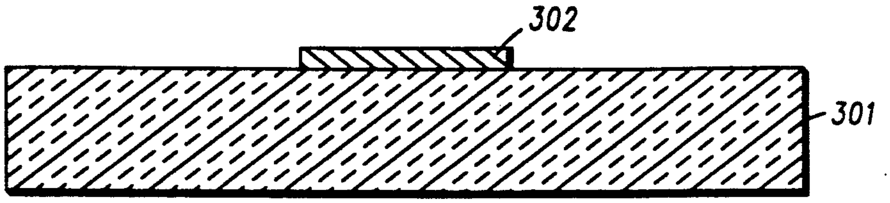
FIGS. 3*a*–*d* provide a side elevational cross-sectional depiction of a structure resulting from deposition of a patterned conductive layer on a surface of the substrate.
Figure 3B:
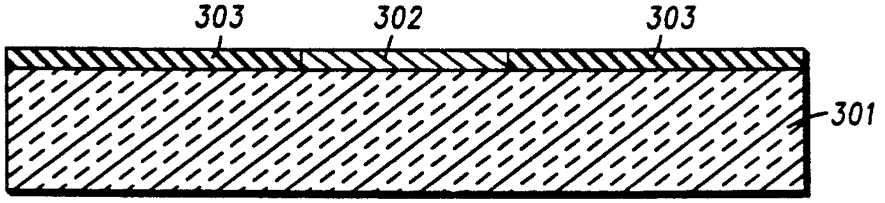
Figure 3C:
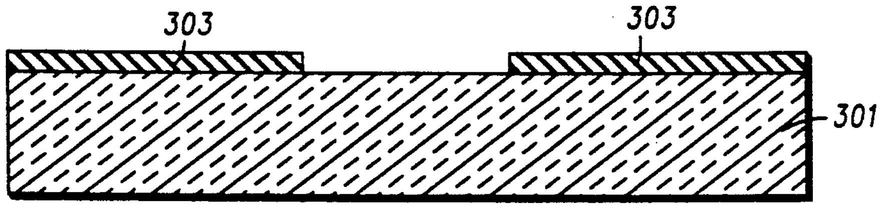
Figure 3D:
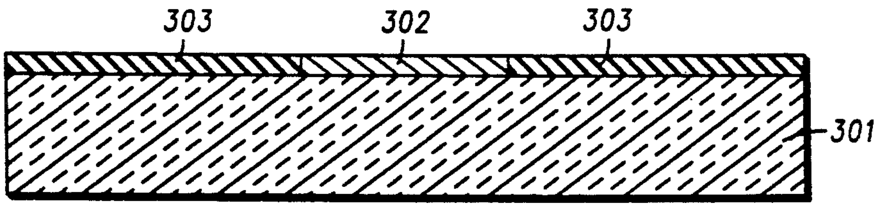

Various methods are commonly employed for providing selective matrix addressing of pluralities of FEDs which have been fabricated as arrays to form a single electronic device. One such method of addressing may be realized by forming conductive strips (302) onto a surface of a substrate (301) (FIG. 3*a*). In this embodiment, a conductive layer is deposited and selectively patterned (FIG. 3*a*). Subsequent deposition of an insulator and implementation of a planarization step yields insulator material (303) disposed on a surface of the substrate (301) of substantially the same thickness as the conductive strip (302) (FIG. 3*b*). Other methods of realizing the conductive strips may utilize selective growth or deposition techniques. For example, after depositing and selectively patterning an insulator layer (303) on the surface of the substrate (301) (FIG. 3*c*), a conductor (302) is selectively deposited on the substrate through openings in the insulator layer (303) (FIG. 3*d*). Selective growth, or deposition, of the conductive strips precludes the need for planarization as the conductive strips are formed by selectively opening windows in an insulator to expose at least a part of the surface of the underlying substrate layer and subsequently selectively growing or depositing conductive material within the openings.

Figure 4A:
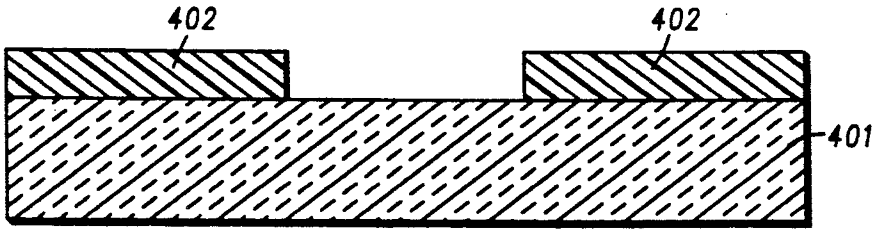
FIGS. 4*a*–*b* provide a side elevational cross-sectional depiction of a structure resulting from selective impurity doping of a semiconductor substrate.
Figure 4B:
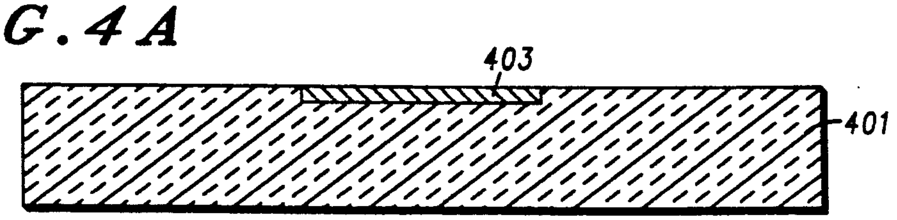

Alternatively, as depicted in FIG. 4*a*, a first surface of the substrate (401) is selectively partially exposed by selectively patterning a photomask layer (402) which photomask layer (402) is disposed on at least a first surface of the substrate (401). An impurity deposition or implantation and diffusion provides a selectively patterned conductive strip (403) disposed in the substrate layer (401) (FIG. 4*b*) after which the photomask layer (402) is removed.

Regardless of which of these embodiments is used, the approach provides a platform layer having both conductive and non-conductive regions. The platform layer may reside on the substrate, or the substrate may be a part of the platform layer, all as indicated above.

Formation of an FED or plurality of FEDs on the structures described above with reference to FIGS. 3*a–d* and FIGS. 4*a–b* provides for a means of selectively independently applying an extraction potential to the central conductor of individual FEDs or simultaneously to the central conductors of pluralities of FEDs.

Presuming availability of vacuum conditions, the structures described above with reference to FIGS. 1*a–j*, FIGS. 2*a–b*, FIGS. 3*a–d*, and FIGS. 4*a–b* will function electronically as cold-cathode field emission devices when a suitable extraction potential is applied to the central conductor and the second conductive layer of the device. Electron emission is induced, preferentially, along the first conductive layer upper edge. Electron trajectory may be, at least partially, controlled by applying extraction potentials of dissimilar magnitudes to each of the extraction electrodes (second conductive layer and central conductor). For the FEDs formed by the method of this invention the emitted electrons will, preferentially, traverse a path substantially outwardly from the cavity region.

What is claimed is:

1. A method of forming a field emission device comprising the steps of:

A) providing a substrate;

B) depositing a plurality of layers of material on at least a surface of the substrate, wherein the plurality of layers of material are substantially planarly parallel to the substrate;

C) performing at least one preferential etch to selectively remove at least a part of each of the plurality of layers of material and selectively expose at least a part of the substrate surface on which substrate surface the plurality of layers of material are disposed, wherein the etched area of the at least a part of each of the plurality of layers of material and the exposed at least part of the substrate surface are substantially axially symmetric with respect to each other;

D) substantially conformally depositing at least a layer of material on exposed transverse surfaces of the plurality of layers of material and the selectively exposed at least part of the substrate surface;

E) performing at least one directed etch, wherein at least one sidewall spacer is formed and wherein the selectively exposed at least part of the substrate surface is at least partially exposed, wherein the formation of the at least one sidewall spacer provides an insulating barrier between the at least plurality of layers of material and a centrally located interior cavity which cavity resides at the location of the exposed at least part of the selectively exposed at least part of the substrate surface;

F) forming a central conductor within the cavity wherein the central conductor is disposed on the exposed at least part of the substrate; and G) performing an etch wherein the at least one spacer is at least partially removed.

2. The method of claim 1 wherein the step of depositing at least a plurality of layers of material includes the steps of:

A) depositing at least one layer of insulating material on at least a surface of the substrate; and B) depositing at least one layer of conductive material on at least a part of a surface of the at least one layer of insulating material.

3. The method of claim 1 wherein the step of depositing at least a plurality of layers of material includes the steps of:

A) depositing at least one layer of insulating material on at least a surface of the substrate; and B) depositing at least one layer of semiconductor material on at least a part of a surface of the at least one layer of insulating material.

4. The method of claim 1 wherein the step of forming a central conductor within the cavity includes the step of:

A) performing a preferential epitaxial growth.

5. The method of claim 1 wherein the step of forming a central conductor within the cavity includes the step of:

A) directionally depositing conductive material within the cavity, wherein the conductive material is at least partially disposed on at least a part of the exposed surface of the at least part of the selectively exposed at least part of the substrate surface.

* * * * *